United States Patent [19]

Gonda

[11] 3,818,361

[45] June 18, 1974

[54] VOLTAGE-POWER BOOSTER FOR AN OPERATIONAL AMPLIFIER

[75] Inventor: Tsunemi Gonda, Kawasaki, Japan

[73] Assignee: Nippon Kogaku K.K., Tokyo, Japan

[22] Filed: Dec. 12, 1972

[21] Appl. No.: 314,358

[30] Foreign Application Priority Data

Dec. 20, 1971 Japan .............................. 46-102592

[52] U.S. Cl. ........................ 330/22, 330/15, 330/24, 323/23

[51] Int. Cl. .............................................. H03f 3/68

[58] Field of Search ............ 323/23, 25; 307/31, 35, 307/52; 330/141, 69 C, 22 C, 30 D

[56] References Cited

UNITED STATES PATENTS

| | | | |
|---|---|---|---|
| 3,469,203 | 9/1969 | Potras | 330/84 |
| 3,470,486 | 9/1969 | Beelitz | 330/30 D |
| 3,646,428 | 2/1972 | Torok | 323/23 X |

*Primary Examiner*—Nathan Kaufman

*Attorney, Agent, or Firm*—Shapiro and Shapiro

[57] ABSTRACT

A voltage-power booster for an operational amplifier employs positive and negative voltage amplifier circuits connected to the positive and negative voltage supply terminals of the operational amplifier to produce output voltages for positive and negative signals which exceed the rated output voltage of the operational amplifier.

5 Claims, 5 Drawing Figures

VOLTAGE-POWER BOOSTER FOR AN OPERATIONAL AMPLIFIER

BACKGROUND OF THE INVENTION

1. Field of the Invention

This invention relates to a voltage-power booster for an operational amplifier.

2. Description of the Prior Art

There are two conventional types of power boosters for providing power greater than the rated output of an operational amplifier, namely, the emitter-follower type and the complementary type. The emitter-follower type of power booster is effective only for a single output current polarity, whereas the complementary type of power booster is effective for both positive and negative output currents. With both types of boosters power amplification is provided by current amplification. no voltage amplification being effected. It is therefore impossible to obtain an output voltage greater than the rated output voltage of the operational amplifier (usually, of the order of ±10 volts).

For this reason, where a greater voltage is required, a voltage amplifier circuit must be added to the output of the operational amplifier. Such voltage amplifier circuits usually require a number of complex elements and must be designed independently of the operational amplifier. Different types of operational amplifiers may require entirely different voltage amplifier circuits depending upon the characteristic of the operational amplifier.

SUMMARY OF THE PRESENT INVENTION

It is an object of the present invention to solve the above-noted problems by providing a voltage-power booster which produces positive and negative voltages greater than the rated output voltage of the operational amplifier with which the booster is combined and which does not require the usual types of voltage amplifiers connected to the output terminal of the operational amplifier.

In accordance with the present invention, a voltage-power booster is combined with an operational amplifier and includes voltage amplifiers connected to the positive and negative voltage supply terminals of the operational amplifier and connected together to provide a new output terminal for the operational amplifier.

BRIEF DESCRIPTION OF THE DRAWINGS

The above object and other features of the present invention will become fully apparent from the following detailed description taken in conjunction with the accompanying drawings, in which.

DESCRIPTION OF THE PREFERRED EMBODIMENTS

Figure 1:
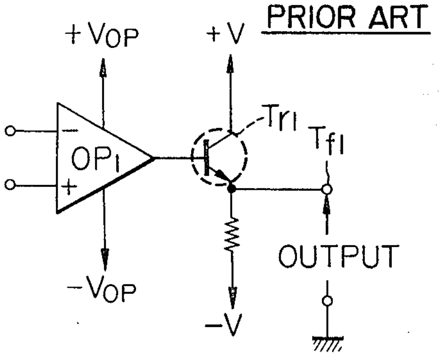
FIG. 1 diagrammatically shows a conventional power booster circuit of the emitter-follower type.

Referring to FIG. 1, there is shown a conventional power booster of the emitter-follower type. An npn transistor T*r*1 is connected as an emitter-follower and the base of said npn transistor T*r*1 is connected with the usual output terminal of an operational amplifier OP1, so that the output terminal T*f*1 of the emitter-follower provides the output terminal of a new operational amplifier including the emitter-follower. This arrangement is effective only for a positive output current since the transistor used is a npn type.

Figure 2:
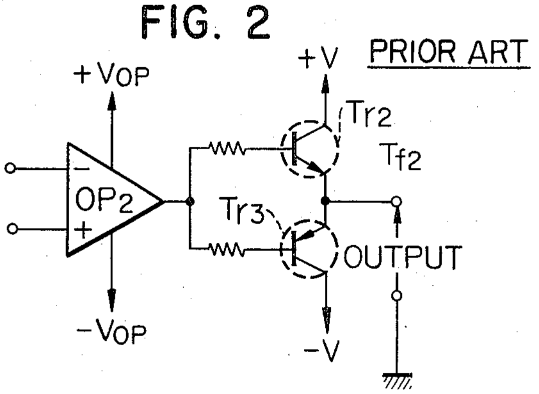
FIG. 2 diagrammatically shows a conventional power booster circuit of the complementary type.

FIG. 2 shows a conventional power booster of the complementary type. Complementary npn and pnp transistors T*r*2 and T*r*3 have their bases connected with the usual output terminal of an operational amplifier OP2, and their emitters connected together, so that an output terminal T*f*2 is provided for a new operational amplifier including the transistors. This arrangement is effective to provide both positive and negative output currents.

Both types of prior art power boosters suffer from the problems noted previously.

Figure 3:
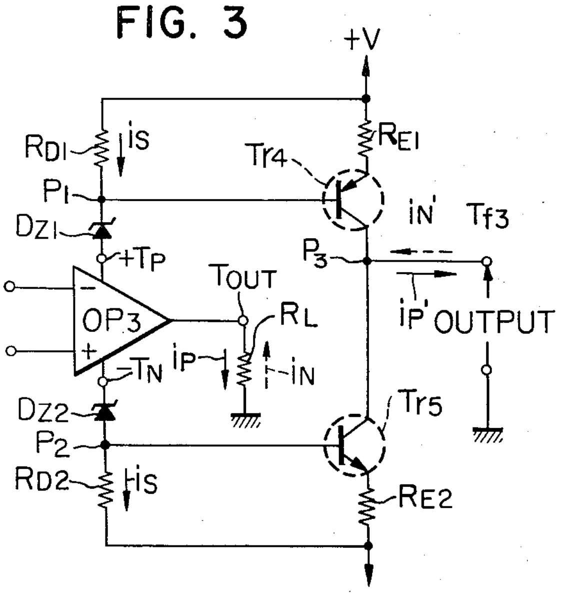
FIG. 3 diagrammatically shows the circuit of the present invention.

Referring now to FIG. 3, there is shown a circuit arrangement according to an embodiment of the present invention. A Zener diode D*z*1 has its anode connected with the positive voltage source terminal T*p* of an operational amplifier OP3. The Zener voltage V*z*1 of the Zener diode D*z*1 is selected to be approximately equal to the difference between the positive voltage source (+V) and the rated source voltage V*op* of the operational amplifier OP3 (i.e., $Vz1 \approx V - Vop$). The function of the Zener diode D*z*1 is to permit application to a later-described transistor T*r*4 of a positive source voltage greater than the rated source voltage V*op* of the operational amplifier OP3 and to apply the rated source voltage V*op* to the operational amplifier OP3. Instead of the Zener diode D*z*1, a new voltage source may be connected between P*l* and T*p*, for example, in such a manner that the positive and negative terminals thereof are connected with P*l* and T*p*, respectively, the voltage VB of the new voltage source being selected to satisfy the condition $VB \approx V - Vop$. Where very great voltage amplification is not required, the Zener diode D*z*1 may be eliminated and P*l* and T*p* may be connected directly together. In this latter case, the positive source voltage +V is of course selected to a level approximately equal to the rated source voltage V*op* of the operational amplifier OP3, unlike the previously described cases, where the positive source voltage +V is substantially higher than V*op*. The cathode of the Zener diode D*z*1 is connected with one end P*l* of a resistor RD1 while the positive voltage source +V is connected with the other end of the resistor. A pnp transistor T*r*4 has its base connected with said end P*l* of the resistor RD1, is emitter connected with the positive voltage source +V via resistor RE1, and its collector connected with terminal P3. These elements RD1, D*z*1, RE1 and T*r*4 together constitute a positive voltage-power amplifier circuit.

A Zener diode D*z*2 has its cathode connected with the negative voltage source terminal TN of the operational amplifier OP3. The Zener voltage V*z*2 of the Zener diode D*z*2 is approximately equal to the difference between the negative source voltage −V and the rated source voltage −V*op* of the operational amplifier OP3 (i.e., $Vz \approx |-V| - |-Vop|$). For the same reason as that described with respect to the Zener diode D*z*1, the Zener diode D*z*2 may be either replaced by a new voltage source or eliminated. The anode of the Zener diode Dz2 is connected with one end P2 of a resistor RD2 while the negative voltage source −V is connected with the other end of the resistor. An npn transistor Tr5 has its base connected with one end P2 of the resistor RD2, its emitter connected with the negative voltage source −V via resistor RE2, and its collector connected with terminal P3. These elements RD2, Dz2, RE2 and Tr5 together constitute a negative voltage-power amplifier circuit. The output terminal T out of the operational amplifier OP3 is grounded through a load resistor RL. The load resistor RL is substantially equal to the rated load resistance of the operational amplifier OP3. Terminal P3 is connected to the new output terminal Tf3 of the new operational amplifier provided with a voltage-power booster.

Operation of the above-described circuit will now be described. It is assumed that the new operational amplifier is utilized in an adder circuit, a subtractor circuit or an inverter circuit to supply an input voltage. Even for a zero input, there flows through the resistors RD1 and RD2 a certain constant current $i_S$ determined by the characteristics of source voltages +V, −V, Zener diodes Dz1, Dz2, resistors RD1, RD2 and operational amplifier OP3. As a result, a predetermined voltage drop occurs across the resistors RD1 and RD2. On the other hand, no current flows through the load resistor RL. By selecting equal values for resistances of the resistors RD1 and RD2, for resistances of the resistors RE1 and RE2 and for the Zener voltages Vz1 and Vz2 of the Zener diodes Dz1 and Dz2, the potential at the terminal P3 will become zero if the input voltage is zero.

If the input voltage is made positive or negative, a positive current $i_P$ or a negative current $i_N$, respectively, will flow through the load resistor RL in the direction of the arrows in accordance with the positive or negative sign of the input voltage, respectively. It will be apparent from the usual properties of the operational amplifier that the load current $i_P$ or $i_N$ is variable substantially in proportion to the input voltage. Further, the flow of such load current varies the current flowing through the resistor RD1 or RD2, so that a voltage variation proportional to the input voltage occurs across the resistor RD1 or RD2. Such voltage variation is applied to transistor Tr4 and Tr5 for amplification.

More specifically, a voltage variation induced at the terminal P1 by the positive current $i_P$ is amplified by the transistor Tr4. Thus, an output current $i_P'$, corresponding to the voltage variation at the terminal P1 is supplied by the transistor Tr4. During that time, the transistor Tr5 remains substantially non-conductive.

Similarly, a voltage variation produced at the terminal P2 by the negative current $i_N$ is amplified by the transistor Tr5. As a result, an output current $i_N'$, corresponding to the voltage variation at the terminal P2 is supplied by the transistor Tr5. During that time, the transistor Tr4 remains substantially non-conductive. Therefore, the amplitude of the output voltage provided from the output terminal Tf3 will be substantially equal to that of the source voltage $|\pm V| = |\pm Vop| + |\pm Vz|$. Also, where the Zener diodes Dz1 and Dz2 are eliminated as mentioned previously, the amplitude of the output voltage provided from the output terminal Tf3 will be substantially equal to that of the source voltage $|\pm V| = |\pm Vop|$.

According to the present invention, an output voltage greater than the rated output voltage of the operational amplifier OP3 can be provided from the output terminal Tf3, which means that voltage amplification has been effected. As a result, the present invention can provide a voltage and power booster of high efficiency and can utilize voltage with a very high efficiency.

Figure 4:
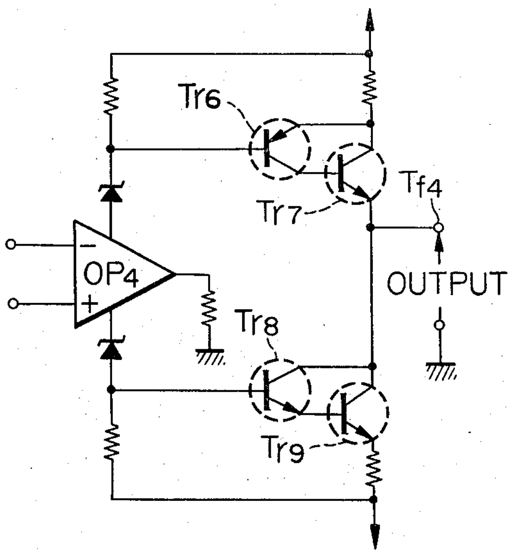
FIG. 4 diagrammaticaly shows a modified circuit of the present invention.

If it is desired to obtain a still greater output power, the transistor Tr4 in FIG. 3 may be replaced by a complementary connection of a pair of pnp and npn transistors Tr6 and Tr7 as shown in FIG. 4, and the transistor Tr5 by a Darlington connection of two npn transistors Tr8 and Tr9. In these cases, it will be apparent that the transistors Tr7 and Tr9 are power transistors.

Figure 5:
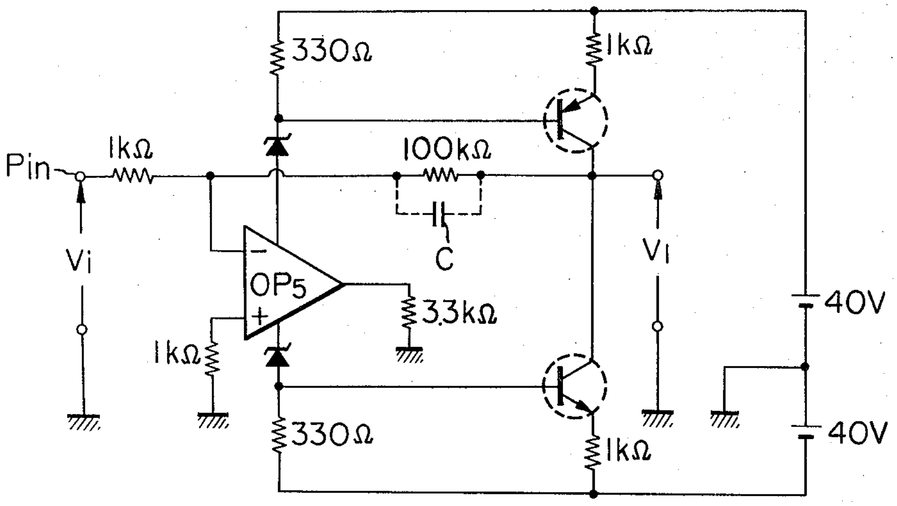
FIG. 5 is a circuit diagram showing a practical circuit of the present invention.

A practical application of the FIG. 3 embodiment is shown in FIG. 5, which illustrates an inverter-amplifier with a gain of 100. In this figure, the resistor elements of FIG. 3 are designated as by 330Ω for resistors RD1, RD2, 1KΩ for resistors RE1, RE2, and 3.3 KΩ for resistor RL. The Zener voltage of the Zener diodes is $Vz1 = Vz2 \approx 2.4V$ and the source voltage $|+V| = |-V| = 40V$. Further, a resistor of 100KΩ is connected between the terminal P3 and the inverting input terminal of the operational amplifier OP3 to apply a negative feedback. A resistor of 1KΩ is further connected between the inverting input terminal and the input terminal Pin. A capacitor C of small capacitance is parallel-connected with the 100KΩ resistor as indicated by a broken line. The capacitor C may be provided, if required, to prevent oscillation which might occur in some types of operational amplifiers.

In this embodiment, it is possible to obtain a voltage-power booster capable of high rate voltage utilization whose output amplitude is 78V (peak-to-peak) and a fraction.

The present invention as described above has the following advantages:

1. It can provide a voltage-power booster for an operational amplifier which provides an output voltage of great amplitude without interfering with the usual characteristics of the operational amplifier;
2. The number of elements in use is reduced, to a great economical advantage; and
3. Utilization of the gain not only of the operational amplifier but also of the voltage amplifier transistors enables a great deal of negative feedback to be applied, which results in improved linearity and stability.

Various types of operational amplifiers may be provided with boosters in accordance with the invention without requiring specially designed and complex voltage amplifiers connected in cascade with the operational amplifier. Merely for purposes of illustration, the operational amplifier may be a type 709 or a type LM101 described on pages 10–24 through 10–26 of Handbook of Semiconductor Electronics, Third Edition, McGraw-Hill Book Co., 1970.

I claim:

1. A combination of an operational amplifier and a voltage-power booster therefor, including:
an operational amplifier;
a load resistor having one end thereof connected with the output terminal of said operational amplifier and the other end grounded;
a first voltage source having the negative terminal thereof grounded;
a first resistance element having one end thereof connected with the positive terminal of said first voltage source and the other end connected with the positive voltage source terminal of said operational amplifier;

a pnp transistor having the base terminal thereof connected with said other end of said first resistance element, the emitter terminal of said pnp transistor being connected with the positive terminal of said first voltage source, the collector terminal of said pnp transistor being operative as the output terminal of said booster;

a second voltage source having the positive terminal thereof grounded;

a second resistance element having one end thereof connected with the negative terminal of said second voltage source and the other end connected with the negative voltage source terminal of said operational amplifier and an npn transistor having the base thereof connected with said other end of said second resistance element, the emitter terminal of said npn transistor being connected with the negative terminal of said second voltage source, the collector terminal of said npn transistor being connected with the collector terminal of said pnp transistor.

2. A combination according to claim 1, wherein the voltages of said first and second voltage sources are greater than the rated source voltage of said operational amplifier, and said combination further includes:

first voltage dropping means connected between the positive voltage source terminal of said operational amplifier and said other end of said first resistance element, said first voltage dropping means causing a voltage drop between the positive voltage source terminal of said operational amplifier and said first resistance element so that a voltage approximately equal to the rated source voltage of said operational amplifier may be applied to the positive voltage source terminal of said operational amplifier; and second voltage dropping means connected between said other end of said second resistance element and the negative voltage source terminal of said operational amplifier, said second voltage dropping means causing a voltage drop between the negative voltage source terminal of said operational amplifier and said second resistance element so that a voltage approximately equal to the rated source voltage of said operational amplifier may be applied to the negative source voltage terminal of said operational amplifier.

3. A combination according to claim 2, wherein said first voltage dropping means is a Zener diode having the cathode thereof connected with said other end of said first resistance element and the anode thereof connected with the positive voltage source terminal of said operational amplifier, and said second voltage dropping means is a Zener diode having the cathode thereof connected with the negative voltage terminal of said operational amplifier and the anode thereof connected with said other end of said second resistance element.

4. A combination according to claim 3, further including a third resistance element connected between the positive terminal of said first voltage source and the emitter terminal of said pnp transistor, and a fourth resistance element connected between the negative terminal of said second voltage source and the emitter terminal of said npn transistor.

5. A combination according to claim 4, wherein the resistance values of said first and second resistance elements are equal, the resistance values of said third and fourth resistance elements are equal, and the Zener voltages of said two Zener diodes are equal.

* * * * *